United States Patent
Hayamizu et al.

(10) Patent No.: US 8,303,797 B2
(45) Date of Patent: Nov. 6, 2012

(54) CLEANING SYSTEM AND CLEANING METHOD

(75) Inventors: Naoya Hayamizu, Kanagawa-ken (JP); Yukihiro Shibata, Kanagawa-ken (JP); Masaaki Kato, Kanagawa-ken (JP); Hiroyuki Fukui, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 961 days.

(21) Appl. No.: 11/763,065

(22) Filed: Jun. 14, 2007

(65) Prior Publication Data
US 2008/0110766 A1  May 15, 2008

(30) Foreign Application Priority Data
Jun. 16, 2006 (JP) .................. 2006-168162

(51) Int. Cl.
*C08B 3/10* (2006.01)
*C25B 1/28* (2006.01)
(52) U.S. Cl. ............. 205/471; 205/472; 204/242; 134/2
(58) Field of Classification Search .................. 205/471, 205/472; 204/242; 134/2
See application file for complete search history.

(56) References Cited

U.S. PATENT DOCUMENTS
6,517,998 B1 * 2/2003 Noda et al. .................... 430/329
6,649,070 B2 * 11/2003 Inagaki .......................... 210/749
6,855,242 B1 * 2/2005 Comninellis et al. ......... 205/471

FOREIGN PATENT DOCUMENTS
| JP | 2001-192874 | A | 7/2001 |
| JP | 2006-111943 | | 4/2006 |
| JP | 2006-114880 | A | 4/2006 |
| JP | 2007-332441 | A | 12/2007 |
| KR | 1020030079726 | A | 10/2003 |
| TW | 451335 | B | 8/2001 |
| TW | 200610841 | | 4/2006 |

OTHER PUBLICATIONS

Serrano et al., Electrochemical preparation of peroxodisulfuric acid using boron doped diamond thin film electrodes, (2002), Electrochimica Acta 48 pp. 431-436.*
Korean Patent Office Notification of Reason for Refusal dated Aug. 18, 2008.
Taiwanese Office action for 096121452 dated Mar. 8, 2011.
Japanese Office action for 2007-160785 dated May 30, 2012.

* cited by examiner

*Primary Examiner* — Arun S Phasge
(74) *Attorney, Agent, or Firm* — Pearne & Gordon LLP

(57) ABSTRACT

A cleaning system includes: a sulfuric acid electrolytic portion configured to electrolyze a sulfuric acid solution to generate an oxidizing substance in an anode chamber, a concentrated sulfuric acid supply portion configured to supply a concentrated sulfuric acid solution to the anode chamber, and a cleaning treatment portion configured to carry out cleaning treatment of an object to be cleaned using an oxidizing solution comprising the oxidizing substance. The sulfuric acid electrolytic portion has an anode, a cathode, a diaphragm which is provided between the anode and the cathode, the anode chamber which is demarcated between the anode and the diaphragm and a cathode chamber which is demarcated between the cathode and the diaphragm.

19 Claims, 8 Drawing Sheets

BEFORE WASHING TREATMENT

EXAMPLE TO WHICH THE INVENTION IS APPLIED

COMPARATIVE EXAMPLE

| Term | | Treatment time (min) | | |
|---|---|---|---|---|
| | | 1 | 2 | 5 |
| Treatment temperature (°C) | 140 | ○ | ○ | ○ |
| | 160 | ○ | ○ | ○ ○ |

FIG. 6A

| Term | | Treatment time (min) | | |
|---|---|---|---|---|
| | | 1 | 2 | 5 |
| Treatment temperature (°C) | 140 | × | × | × |
| | 160 | × | × | × |

FIG. 6B

CLEANING SYSTEM AND CLEANING METHOD

CROSS-REFERENCE TO RELATED APPLICATIONS

This application is based upon and claims the benefit of priority from the prior Japanese Patent Application No. 2006-168162, filed on Jun. 16, 2006; the entire contents of which are incorporated herein by reference.

BACKGROUND OF THE INVENTION

1. Field of the Invention

The present invention relates to a cleaning system and a cleaning method, and in particular, to a cleaning system and a cleaning method utilizing an oxidizing substance that is generated by the electrolysis of sulfuric acid.

2. Background Art

Such a system has been known conventionally that uses persulfate ions generated by the electrolysis of an aqueous solution of sulfuric acid to clean and remove resist etc. that has adhered to a silicon wafer etc., while circulating a persulfate solution through an electrolytic reaction vessel and a cleaning vessel (JP-A-2006-111943).

In JP-A-2006-111943, concentrated sulfuric acid of 98% is diluted with ultrapure water, which is then supplied to an electrolytic reaction vessel. Such an oxidation-activating species, for example, as peroxomonosulfuric acid that is generated through the electrolysis reaction of sulfuric acid is decomposed through reaction with water. Therefore, in order to generate stably the peroxomonosulfuric acid to enhance the efficiency of cleaning and peeling the resist etc., it is desirable to avoid carrying out an electrolysis in such a water-rich state as described in JP-A-2006-111943 wherein concentrated sulfuric acid is diluted with ultrapure water.

SUMMARY OF THE INVENTION

According to an aspect of the invention, there is provided a cleaning system including: a sulfuric acid electrolytic portion having an anode, a cathode, a diaphragm which is provided between the anode and the cathode, an anode chamber which is demarcated between the anode and the diaphragm and a cathode chamber which is demarcated between the cathode and the diaphragm, the sulfuric acid electrolytic portion being configured to electrolyze a sulfuric acid solution to generate an oxidizing substance in the anode chamber, a concentrated sulfuric acid supply portion configured to supply a concentrated sulfuric acid solution to the anode chamber, and a cleaning treatment portion configured to carry out cleaning treatment of an object to be cleaned using an oxidizing solution comprising the oxidizing substance.

According to another aspect of the invention, there is provided a cleaning method including: electrolyzing a concentrated sulfuric acid solution of 90% by mass or more which is supplied to an anode chamber which is demarcated between an anode facing a cathode interposing a diaphragm therebetween and the diaphragm to generate an oxidizing substance in the anode chamber; and carrying out cleaning treatment of an object to be cleaned using an oxidizing solution containing the oxidizing substance.

BRIEF DESCRIPTION OF THE DRAWINGS

FIG. 6A is a table for exemplifying the relation between a time necessary for the resist mask peeling when an oxidizing solution that is obtained by the present embodiment is used and a treatment temperature, and FIG. 6B is a table similar to FIG. 6A when an oxidizing solution according to the Comparative Example is used.

DETAILED DESCRIPTION OF THE INVENTION

An embodiment of the present invention will be described hereinafter with reference to the drawings.

Figure 1:
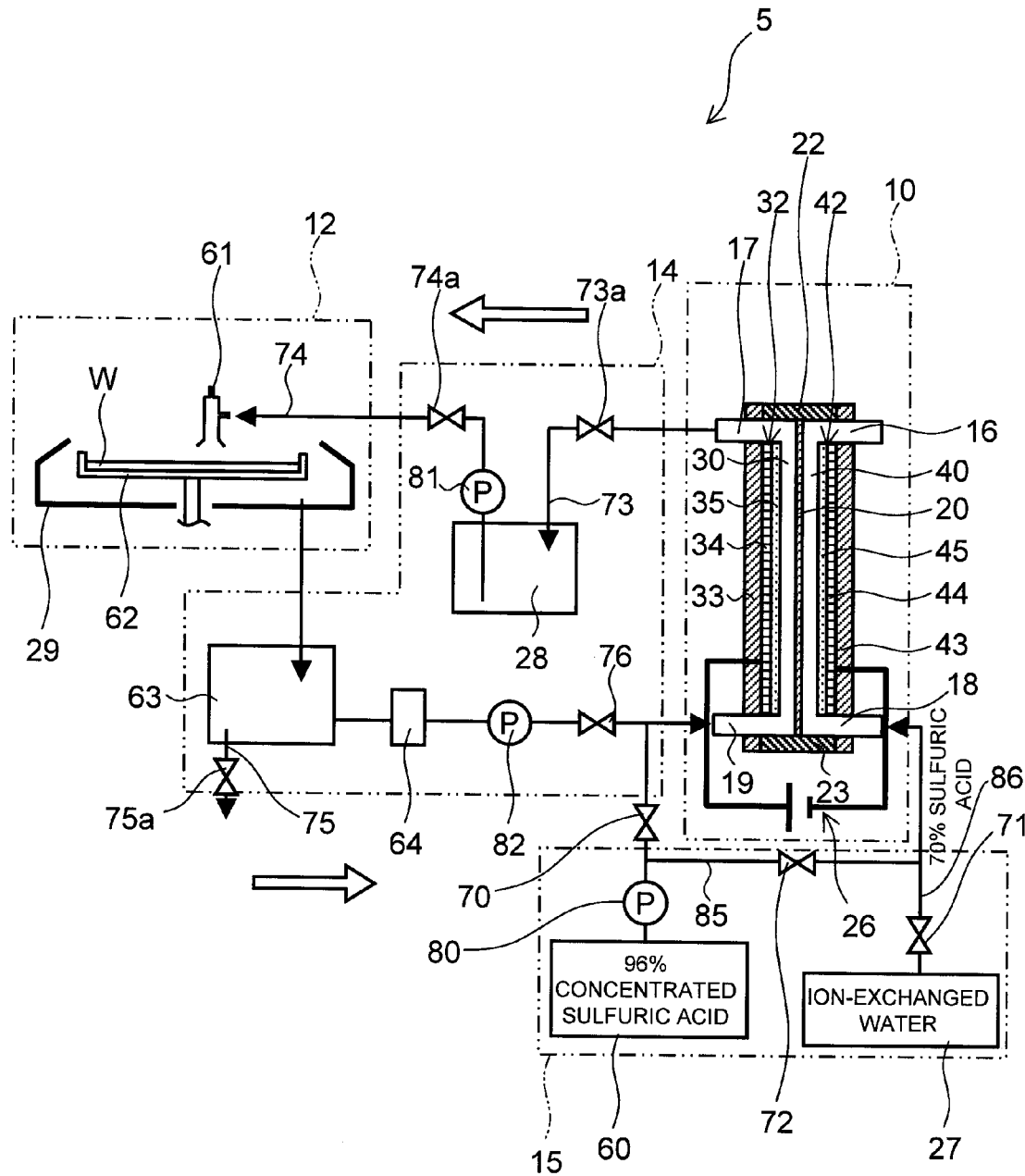
FIG. 1 is a schematic view for exemplifying the constitution of a cleaning system according to an embodiment of the present invention.

FIG. 1 is a schematic view for exemplifying the constitution of a cleaning system 5 according to the embodiment of the present invention.

The cleaning system 5 according to the present embodiment has a sulfuric acid electrolytic portion 10, a cleaning treatment portion 12, a solution circulation portion 14, and a solution supply portion 15.

The sulfuric acid electrolytic portion 10 has such function as generating an oxidizing substance by electrolyzing a sulfuric acid solution. In addition, although the oxidizing power of a solution including an oxidizing substance is lowered when removing contaminants that have adhered to an object to be cleaned using a solution including the oxidizing substance, the sulfuric acid electrolytic portion 10 also has such function as recovering the lowered oxidizing power.

The sulfuric acid electrolytic portion 10 has an anode 32, a cathode 42, a diaphragm 20 that is provided between the anode 32 and the cathode 42, an anode chamber 30 demarcated between the anode 32 and the diaphragm 20, and a cathode chamber 40 demarcated between the cathode 42 and the diaphragm 20.

At the upper end of the diaphragm 20 and the anode chamber 30, an upper end-sealing portion 22 is provided, and at the lower end of the diaphragm 20 and the cathode chamber 40, a lower end-sealing portion 23 is provided. The anode 32 and the cathode 42 face each other interposing the diaphragm 20 therebetween. The anode 32 is supported by an anode support 33, and the cathode 42 is supported by a cathode support 43. Between the anode 32 and the cathode 42, a direct-current power source 26 is connected.

The anode 32 is composed of an electroconductive anode base substance 34 and an anode electroconductive membrane 35 that is formed on the surface of the anode base substance 34. The anode base substance 34 is supported on the inner surface of the anode support 33, and the anode electroconductive membrane 35 abuts on the anode chamber 30.

The cathode 42 is composed of an electroconductive cathode base substance 44, and a cathode electroconductive membrane 45 that is formed on the surface of the cathode base substance 44. The cathode base substance 44 is supported on the inner surface of the cathode support 43, and the cathode electroconductive membrane 45 abuts on the cathode chamber 40.

To the anode chamber 30, an anode inlet portion 19 is formed on the lower end side thereof, and an anode outlet portion 17 is formed on the upper end side thereof. The anode inlet portion 19 and the anode outlet portion 17 are communicated with the anode chamber 30. To the cathode chamber 40, a cathode inlet portion 18 is formed on the lower side thereof, and a cathode outlet portion 16 is formed on the upper end side thereof. The cathode inlet portion 18 and the cathode outlet portion 16 are communicated with the cathode chamber 40.

The cleaning treatment portion 12 has such function as cleaning an object to be cleaned W using a solution containing an oxidizing substance (oxidizing solution) obtained in the sulfuric acid electrolytic portion 10. The oxidizing solution obtained in the sulfuric acid electrolytic portion 10 is supplied to a nozzle 61 provided to the cleaning treatment portion 12 via the solution circulation portion 14. The nozzle 61 has a discharge port for discharging the oxidizing solution for the object to be cleaned W. So as to face the discharge port, a rotary table 62 for placing the object to be cleaned W is provided. The rotary table 62 is provided inside a cover 29. By discharging the oxidizing solution from the nozzle 61 toward the object to be cleaned W, contaminants on the object to be cleaned W can be removed. As the cleaning treatment portion 12, a sheet-feed type or a batch type resist-peeling apparatus can be mentioned as an example.

The solution circulation portion 14 has a function of circulating the oxidizing solution through the sulfuric acid electrolytic portion 10 and the cleaning treatment portion 12. The oxidizing solution having been generated in the sulfuric acid electrolytic portion 10 is supplied from the anode outlet portion 17 to the cleaning treatment portion 12 via the solution circulation portion 14.

The anode outlet portion 17 is connected to a tank 28 via a conduit line 73 that is provided with an on-off valve 73a. The tank 28 is connected to the nozzle 61 via a conduit line 74, and the oxidizing solution stored in the tank 28 is supplied to the nozzle 61 via the conduit line 74 by the operation of a pump 81. For the conduit line 74, an on-off valve 74a is provided on the discharge side of the pump 81. By storing the oxidizing solution in the tank 28, the quantitative fluctuations of the oxidizing solution that is generated in the sulfuric acid electrolytic portion 10 can be buffered. The tank 28 may be provided with a heater, thereby making the temperature control of the oxidizing solution possible.

The oxidizing solution discharged from the cleaning treatment portion 12 passes through a recovery tank 63, a filter 64, a pump 82 and an on-off valve 76 in this order, and is supplied to the anode inlet portion 19 of the sulfuric acid electrolytic portion 10.

The recovery tank 63 is provided with a discharge conduit line 75 and a discharge valve 75a, and has such function as discharging the contaminant that has been cleaned and removed in the cleaning treatment portion 12 to the outside of the system. The filter 64 has such function as filtering the contaminant contained in the oxidizing solution that has been discharged from the cleaning treatment portion 12.

The solution supply portion 15 has such function as supplying a sulfuric acid solution to the sulfuric acid electrolytic portion 10. The solution supply portion 15 has a concentrated sulfuric acid supply portion (tank) 60 for supplying a concentrated sulfuric acid solution to the anode chamber 30 and an ion-exchanged water supply portion (tank) 27 for supplying ion-exchanged water to the cathode chamber 40. The ion-exchanged water supply portion 27 can be installed in the anode chamber 30.

In the concentrated sulfuric acid supply portion 60, a concentrated sulfuric acid solution of 90% by mass or more is stored. The concentrated sulfuric acid solution in the concentrated sulfuric acid supply portion 60 passes through an on-off valve 70 and is supplied to the anode chamber 30 via the conduit line on the downstream side of the on-off valve 76 and the anode inlet portion 19 by the driving of a pump 80.

In the ion-exchanged water supply portion 27, for example, ion-exchanged water is stored. The ion-exchanged water in the ion-exchanged water supply portion 27 passes through an on-off valve 71 and is supplied to the cathode chamber 40 via the cathode inlet portion 18. The concentrated sulfuric acid supply portion 60 and the ion-exchanged water supply portion 27 are connected with each other via a conduit line 85 and an on-off valve 72 that is provided thereto. Then, by merging the concentrated sulfuric acid solution in the concentrated sulfuric acid supply portion 60 with an ion-exchanged water supply channel 86 via the conduit line 85, a sulfuric acid solution having been formed by diluting the concentrated sulfuric acid solution in the concentrated sulfuric acid supply portion 60 with ion-exchanged water is supplied to the cathode chamber 40.

Although, for example, a sulfuric acid solution of about 96% by mass is supplied to the anode chamber 30 via the anode inlet portion 19, for example, a sulfuric acid solution of about 70% by mass is supplied to the cathode chamber 40 via the cathode inlet portion 18. The purpose for lowering the concentration of sulfuric acid to be supplied to the cathode than that to be supplied to the anode is to prevent the damage of the diaphragm 20 through the electrolysis of the sulfuric acid. That is, in the electrolysis reaction of the sulfuric acid, water on the cathode side moves to the anode side to increase the sulfuric acid concentration on the cathode side, and, as the result, the diaphragm 20 tends to be degraded. Further, when an ion-exchange membrane is used for the diaphragm 20, there occurs such problem in concentrated sulfuric acid that the resistance of the ion-exchange membrane increases with the lowering of the water content to raise the chamber voltage. In order to reduce the problem also, the sulfuric acid concentration on the cathode side is lowered to supply water to the ion-exchange membrane and prevent the increase in the resistance.

The on-off valves 70, 71, 72, 73a, 74a, 75a, and 76 have function of controlling the flow volume of various solutions. The pumps 80, 81, and 82 have function of controlling the flow velocity of various solutions.

Next, the generation mechanism of the oxidizing substance in the sulfuric acid electrolytic portion 10 will be described.

Figure 2A:
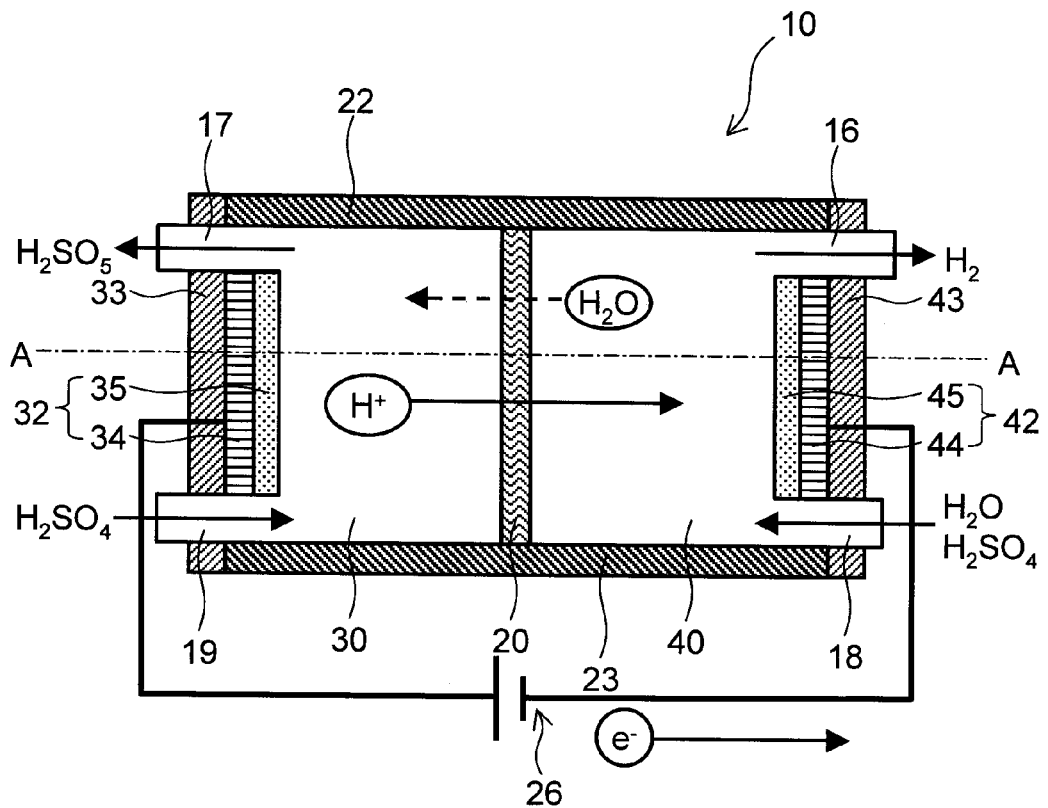
FIG. 2A is a schematic view showing a generation mechanism of an oxidizing substance in a sulfuric acid electrolytic portion.
Figure 2B:
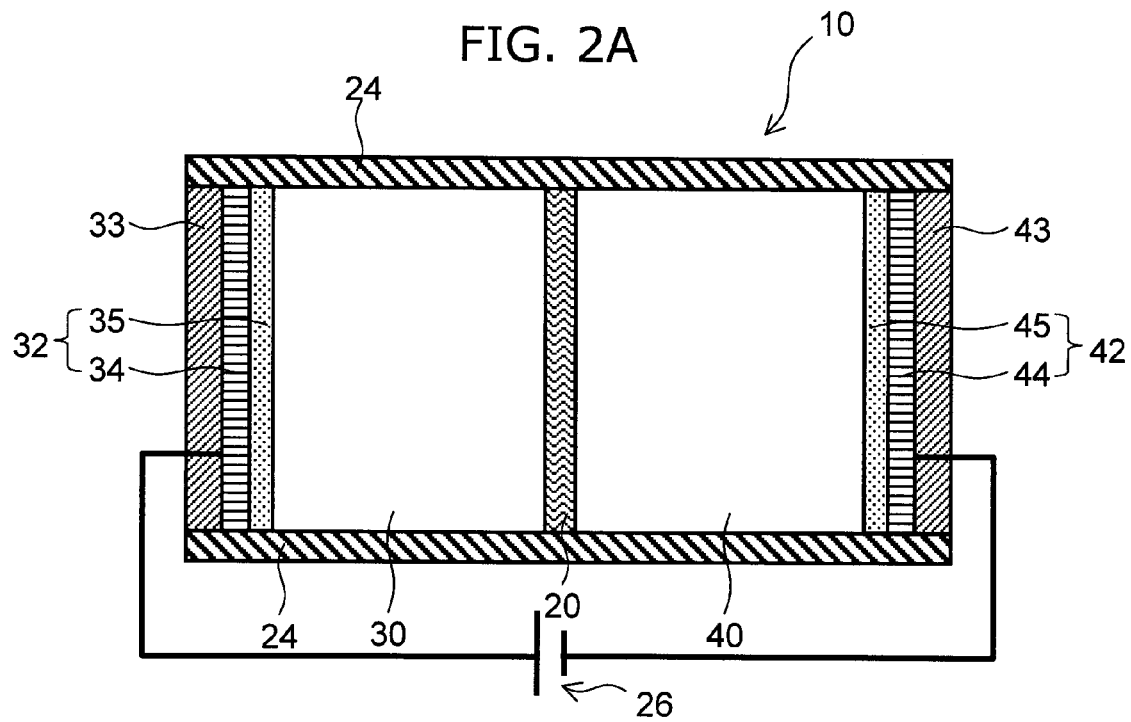
FIG. 2B is a schematic view showing the A-A line cross section in FIG. 2A.

FIG. 2A is a schematic view showing the generation mechanism of the oxidizing substance in the sulfuric acid electrolytic portion 10. FIG. 2B is a schematic view showing the A-A line cross-section in FIG. 2A.

As shown in FIG. 2B, the anode 32 and the cathode 42 are provided facing each other interposing the diaphragm 20 therebetween. The anode 32 is supported by the anode support 33 while abutting the anode electroconductive membrane 35 on the anode chamber 30. The cathode 42 is supported by the cathode support 43 while abutting the cathode electroconductive membrane 45 on the cathode chamber 40. To the both edge portions of the diaphragm 20, the anode support 33 and the cathode support 43, respectively, electrolytic portion casings 24 are provided respectively.

To the anode chamber 30, for example, a sulfuric acid solution of about 96% by mass is supplied from the concentrated sulfuric acid supply portion 60 via the anode inlet portion 19. To the cathode chamber 40, a sulfuric acid solution and ion-exchanged water are supplied from the concentrated sulfuric acid supply portion 60 and the ion-exchanged water supply portion 27 via the cathode inlet portion 8 to give, for example, a sulfuric acid concentration of about 70% by mass.

Then, by applying a positive voltage to the anode 32 and a negative voltage to the cathode 42, electrolysis reaction occurs in each of the anode chamber 30 and the cathode chamber 40. In the anode chamber 30, the reactions represented by the chemical formula 1, the chemical formula 2 and the chemical formula 3 occur.

$$2HSO_4^- \rightarrow S_2O_8^{2-} + 2H^+ + 2e^- \quad \quad 1$$

$$HSO_4^- + H_2O \rightarrow HSO_5^{2-} + 2H^+ + 2e^- \quad \quad 2$$

$$2H_2O \rightarrow 4H^+ + 4e^- + O_2\uparrow \quad \quad 3$$

Here, water ($H_2O$) in the chemical formulae 2 and 3 is the water of 4% contained in the 96% by mass concentrated sulfuric acid solution and the water that penetrates from the cathode via the diaphragm 20. Consequently, in the anode chamber 30, the peroxomonosulfuric acid ion ($HSO_5^-$) is generated through the reaction of the chemical formula 2. There is also such reaction that elementary reactions of chemical formula 1 and chemical formula 3 generates an entire reaction as represented by a chemical formula 4 to generate the peroxomonosulfuric acid ion ($HSO_5^-$) and sulfuric acid. The peroxomonosulfuric acid has stronger cleaning power than sulfuric acid.

$$S_2O_8^{2-} + H^+ + H_2O \rightarrow HSO_5^- + H_2SO_4 \quad \quad 4$$

Also, there is such an instance that, from the elementary reactions of the chemical formulae 1 and 3, hydrogen peroxide ($H_2O_2$) is generated as shown by a chemical formula 5 and then the peroxomonosulfuric acid ion ($HSO^{5-}$) in the chemical formula 4 is generated. Further, peroxodisulfuric acid ($H_2S_2O_8$) may be generated through the reaction of the chemical formula 1. The chemical formulae 4 and 5 represent a secondary reaction from the chemical formula 1.

$$S_2O_8^{2-} + H^+ + H_2O \rightarrow H_2O_2 + H_2SO_4 \quad \quad 5$$

In the cathode chamber 40, as shown by a chemical formula 6, hydrogen gas is generated. This is caused by the travel of the hydrogen ion ($H^+$) that has been generated on the anode to the cathode via the diaphragm 20 to generate the electrolysis reaction. The hydrogen gas is discharged from the cathode chamber 40 via the cathode outlet portion 16.

$$2H^+ + 2e^- \rightarrow H_2\uparrow \quad \quad 6$$

Since peroxomonosulfuric acid ($H_2SO_5$) that has strong oxidizing power and is effective for peeling and removing such an organic material as resist that is used, for example, for the semiconductor process reacts with water to be degraded, it exists unstably in water. Therefore, the oxidizing power lowers and the ability of peeling and removing the resist lowers. Consequently, there is such a trouble that the frequency of exchanging the cleaning solution increases to increase the production cost. In the case where the oxidizing power of the cleaning solution lowers, in addition, for a rework treatment using lithography or the like in a batch type etching apparatus, there is such a problem that only a few sheets can be treated per lot to lower the treatment efficiency. In a semiconductor machine for high speed operation, semiconductors are produced by implanting a high dose of impurity, but when the cleaning solution whose oxidizing power has lowered is used, there occurs such a problem that an intended peeling margin can not be obtained.

In the present embodiment, as shown by a chemical formula 7, it is possible to obtain such an oxidizing solution as that containing an oxidizing substance, for example, peroxomonosulfuric acid ($H_2SO_5$), peroxodisulfuric acid ($H_2S_2O_8$) by electrolyzing a sulfuric acid solution. Water that lowers the oxidizing power of an oxidizing substance is not generated as a by-product, and, instead, hydrogen gas is generated as a by-product. However, the hydrogen gas does not influence the peeling of the resist mask.

$$H_2SO_4 + H_2O \rightarrow \text{Oxidizing substance} + H_2 \quad \quad 7$$

Furthermore, in the present embodiment, the system is constituted in such a manner that, by supplying concentrated sulfuric acid of 90% by mass or more (e.g., about 96% by mass) to the anode chamber 30 in which an oxidizing substance is generated, the oxidizing substance exists in circumstances containing water as little as possible. As the result, in particular, peroxomonosulfuric acid, which is unstable in the presence of water to degrade, can be generated stably, and thus quantitative and a large amount of supply of peroxomonosulfuric acid becomes possible. As the result, it is possible to improve the removing efficiency of, for example, resist and contaminants, to increase the productivity and to achieve the cost reduction.

In the case where peroxomonosulfuric acid is used, the reaction rate thereof with such organic material as resist is large, therefore only a short time is necessary for the peeling of a comparatively large amount of resist to be removed. Further, peroxomonosulfuric acid can effect the peeling at low temperatures, and thus it does not require such an adjusting time as raising a temperature. Further, since peroxomonosulfuric acid can be generated stably in a large amount, the reaction rate thereof with an object to be removed can be increased even at low temperatures.

Note that for the material of the cover 29 in the anode support 33, the cathode support 43, the cathode outlet portion 16, the anode outlet portion 17, the cathode inlet portion 18, the anode inlet portion 19, and the cleaning treatment portion 12, preferred is the use of such fluorine-containing resin as polytetrafluoroethylene from the viewpoint of the resistance to sulfuric acid.

Further, for a tube supplying an oxidizing solution in the cleaning treatment portion 12, a fluorine-containing resin tube that is wound with a heat-insulating material can be used. For this tube, an inline heater that is formed of a fluorine-containing resin may be provided. Also, for a pump sending the oxidizing solution, a bellows pump formed of fluorine-containing resin having heat resistant and oxidation resistant property can be employed.

Further, for the material of various tanks that accommodates a sulfuric acid solution, for example, quartz can be employed. Furthermore, the tank may be provided arbitrarily with an overflow device, a temperature control device and the like.

For the diaphragm 20, for example, such a neutral membrane including a porous diaphragm made of PTFE (Polytetrafluoroethlene) as Poreflone in trade name (but those having been subjected to hydrophilizing treatment), and such cation-exchange membranes as Nafion, Aciplex, and Flemion in trade name can be employed. Of these, the use of the latter cation-exchange membrane is preferred in point that products in both cathode and anode chambers can be produced in a separated state. The size of the diaphragm 20 is, for example, about 50 cm$^2$. For the upper end-sealing portion 22 and the lower end-sealing portion 23, for example, an O-ring that has been coated with fluorine-containing resin is favorably employed.

For the material of the anode conductive base substance 34, for example, p-type silicon or such a valve metal as niobium can be employed. Here, the valve metal means a metal whose metal surface is covered uniformly with the oxide layer thereof through anode oxidation to exert an excellent corrosion resistance. For the cathode electroconductive base substance 44, for example, n-type silicon can be employed.

For the material of the cathode electroconductive membrane 45, for example, glassy carbon can be employed. To the anode chamber 30, concentrated sulfuric acid of 90% by mass or more is supplied, therefore an electroconductive diamond membrane is favorably employed for the material of the anode electroconductive membrane 35 from the viewpoint of durability. Of course, an electroconductive diamond membrane may be also employed for the material of the cathode electroconductive membrane 45.

Both the anode and the cathode may have an electroconductive membrane and a base substance that are formed of the same material. For example, in the case where glassy carbon is employed for the cathode base substance, or an electroconductive diamond self-supporting film is employed for the anode base substance, the base substance itself is an electroconductive membrane having an electrocatalytic property to be able to contribute to the electrolysis reaction.

Diamond has chemically, mechanically and thermally stable properties, but the use thereof in an electrochemical system was difficult because it is not excellent in conductivity. However, an electroconductive diamond membrane can be obtained through film-formation using a hot filament chemical vapor deposition (HF-CVD) method while supplying boron gas or nitrogen gas. The electroconductive diamond membrane has such a large "potential window" as 3 to 5 volts and an electric resistivity of, for example, 5 to 100 mΩ·cm.

Here, the "potential window" is a minimum potential (1.2 volts or more) that is necessary for the electrolysis of water. This "potential window" differs depending on materials. In the case where electrolysis is carried out while using a material that has a large "potential window" and at a potential within the "potential window," there is such a case that an electrolytic reaction having an oxidation-reduction potential within the "potential window" may progress in preference to the electrolysis of water, and that the oxidation reaction or the reduction reaction of a material that is hardly electrolyzed may progress preferentially. Consequently, by using such electroconductive diamond, it becomes possible to degrade or synthesize a material that has been impossible in conventional electrochemical reactions.

The HF-CVD method is a method for forming a film in which a raw material gas is supplied to a tungsten filament in a state of a high temperature to be degraded, thus radicals that are necessary for film growth are formed, and then radicals diffusing to the substrate surface and other reactive gas are reacted on an intended substrate.

Next, the example of experiment using the cleaning system according to the present embodiment will be described.

Figure 3A:
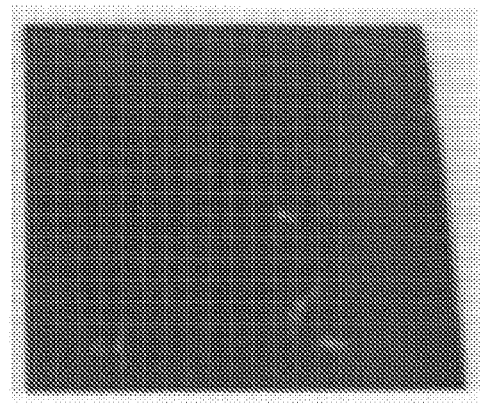
FIG. 3A is an appearance photograph of an evaluation sample before peeling off a resist mask.
Figure 3B:
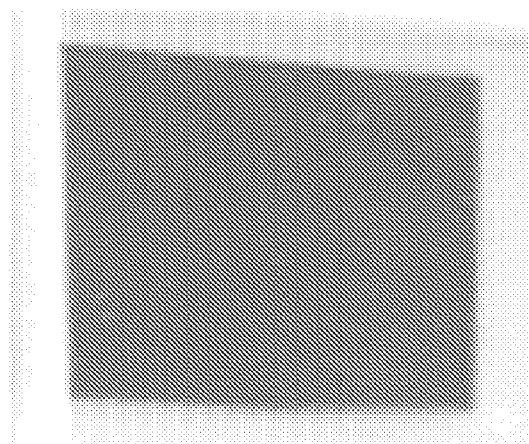
FIG. 3B is an appearance photograph of an evaluation sample having been cleaned with the cleaning system according to the present embodiment.
Figure 3C:
FIG. 3C is an appearance photograph of an evaluation sample according to a Comparative Example.

FIG. 3A is an appearance photograph of an evaluation sample before peeling off the resist mask; FIG. 3B is an appearance photograph of an evaluation sample after the cleaning using the cleaning system according to the present embodiment; FIG. 3C is an appearance photograph of an evaluation sample according to a Comparative Example.

Here, the forming method of an evaluation sample will be described. Firstly, a thermally-oxidized film was formed on a semiconductor wafer, and hexamethyldisilazane (HMDS) was used to increase the adhesiveness between the surface of the semiconductor wafer and a resist mask. Then, a novolac resin-based resist mask was coated on the thermally-oxidized film so as to give a thickness of around 3.0 nm. After that, the resultant product was irradiated with an i-line (wavelength of about 365 nm), subjected to a development treatment and a baking treatment in this order, to form an evaluation sample as shown in FIG. 3A.

For the peeling judgment of the resist mask, particles of the residual resist were counted using a light scattering type particle counter, and then review evaluation was carried out using a scanning electron microscope.

For FIG. 3B, firstly a 96% by mass sulfuric acid solution was electrolyzed under the conditions of 100° C. 10 seconds and an electrolytic current of 1.0 ampere to generate an oxidizing solution, and the oxidizing solution was used for showering and cleaning the evaluation sample for three minutes. After that, the sample was rinsed with pure water, which was then used for carrying out the peeling evaluation of the resist mask.

For the Comparative Example in FIG. 3C, a mixed solution of a 50% by mass sulfuric acid solution and a 1% by mass hydrogen peroxide solution was used for showering and cleaning the evaluation sample for three minutes. After that, the sample was rinsed in the same way as that in the instance of FIG. 3B to be used for carrying out the peeling evaluation of the resist mask.

As the result, for the Comparative Example as shown in FIG. 3C, it was confirmed that the resist mask can not be peeled off. On the contrary, according to the example as shown in FIG. 3B to which the present invention was applied, it was confirmed that the resist mask could be peeled off.

Figure 4:
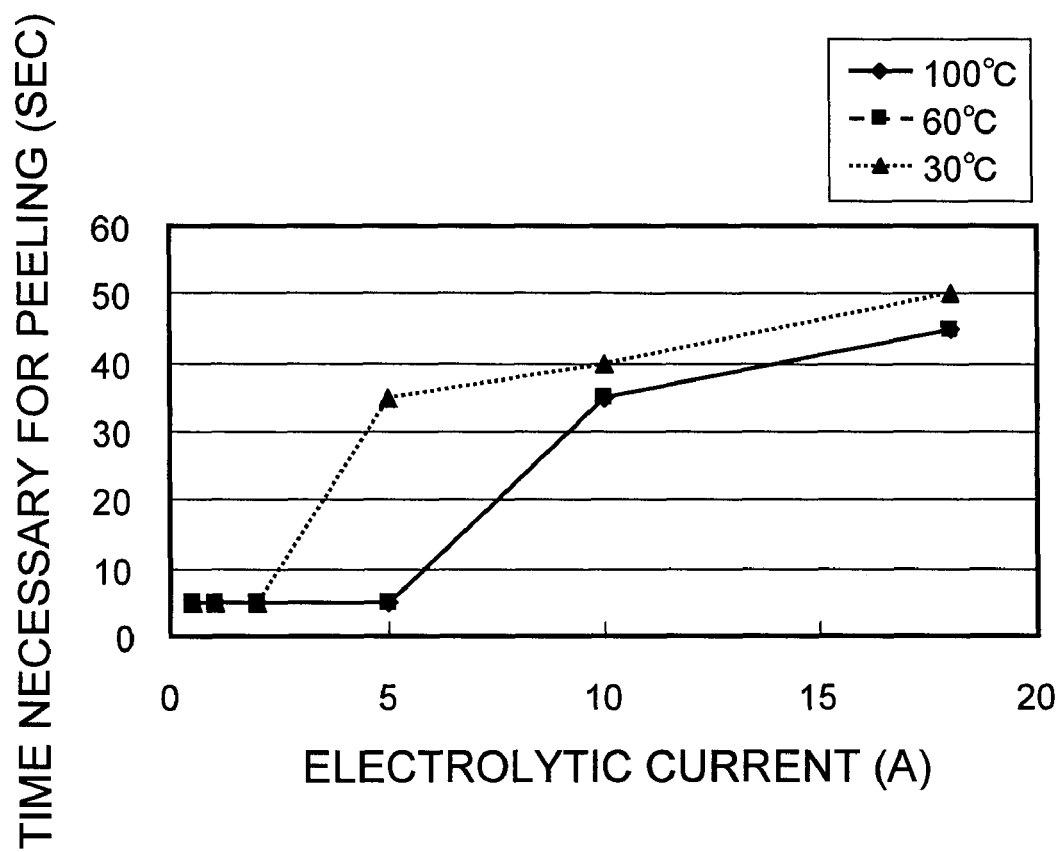
FIG. 4 is a graph chart for exemplifying the evaluation result of the resist mask peeling.

Next, FIG. 4 is a graph chart that exemplifies the result of the peeling evaluation for the resist mask.

The horizontal axis represents the electrolytic current (ampere), and the vertical axis represents time (second) necessary for the peeling. The evaluation sample that was used for this evaluation was the same as that used for the instance of FIG. 3A.

From FIG. 4, it is known that, when the electrolytic current is lowered, the time necessary for the peeling of the resist mask is shortened irrespective of the treatment temperature. It can be also confirmed that the time necessary for the peeling can be shortened by increasing the treatment temperature. But, no difference can be observed when the electrolytic current is, for example, 5 amperes or less. Therefore, the peeling evaluation is carried out while using an evaluation sample for which the peeling is difficult.

Figure 5A:
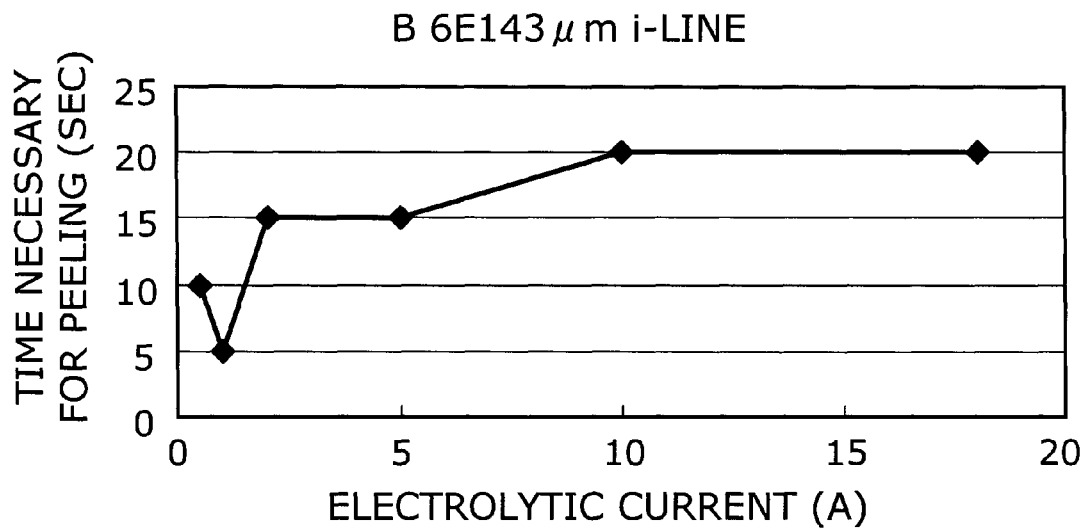
FIG. 5A is a graph chart showing the relation between an electrolytic current that is used for the resist mask peeling and a time necessary for the peeling.
Figure 5B:
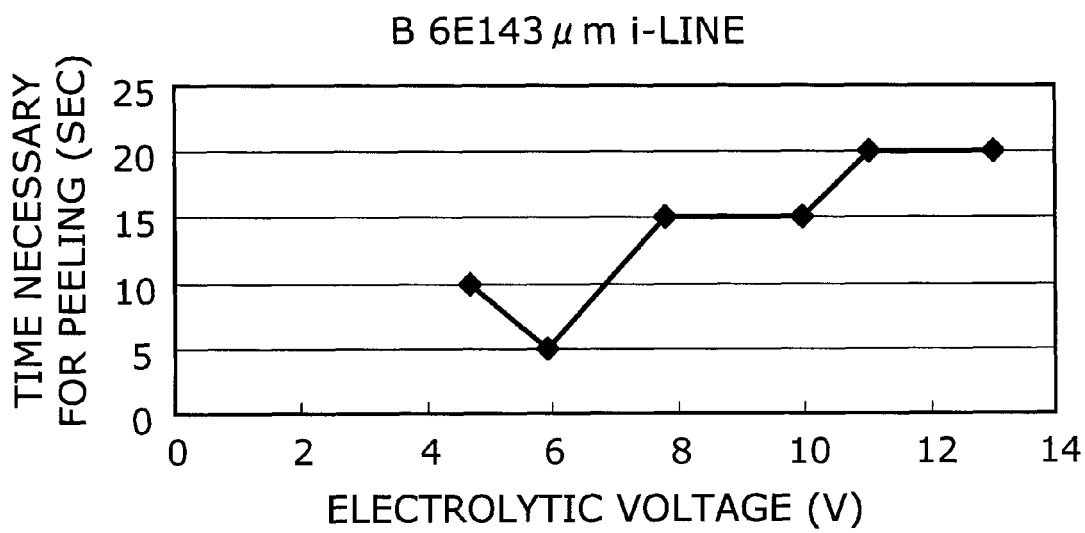
FIG. 5B is a graph chart showing the relation between an electrolytic voltage that is used for the resist mask peeling and a time necessary for the peeling.

FIG. 5A is a graph chart representing the relation between the electrolytic current that was used for the peeling of the resist mask and the time that was necessary for the peeling; and FIG. 5B is a graph chart representing the electrolytic voltage that was used for the peeling of the resist mask and the time that was necessary for the peeling.

In FIG. 5A, the horizontal axis represents the electrolytic current (ampere), and the vertical axis represents the time (second) necessary for the peeling. In FIG. 5B, the horizontal axis represents the electrolytic voltage (volt), and the vertical axis represents the time (second) necessary for the peeling.

In this evaluation, boron (B) ions were accelerated and driven into the evaluation sample as shown in FIG. 3A by an ion implantation method in a dose of, for example, about $6 \times 10^{14}/cm^3$. As the result, the resist mask becomes hardly peelable.

The evaluation sample that had been implanted with B ions was cleaned using the oxidizing solution. As shown in FIG. 5A, it is known that the time necessary for the peeling is shortened along with the lowering of the electrolytic current. In particular, it is known that, in the case of an electrolytic current of 1 ampere, the time necessary for the peeling is the shortest value of such as 5 seconds.

Further, as shown in FIG. 5B, it is known that the time necessary for the peeling is shortened along with the lowering of the electrolytic voltage. In particular, for example, in the case of an electrolytic voltage of 6 volts, the time necessary for the peeling is the shortest value of such as 5 seconds.

Accordingly, it is inferred that the oxidizing chemical species that is generated under this electrolytic voltage or electrolytic current influences the peeling efficiency.

Next, described is the result of the peeling evaluation of the resist mask that was carried out using an evaluation sample from which the resist mask was less peelable as compared with the evaluation sample that was used for the instance of FIG. 5.

FIG. 6A is a table that exemplifies the relation between the time necessary for the peeling of the resist mask when an oxidizing solution that had been obtained according to the present embodiment was used and the treatment temperature. FIG. 6B exemplifies the same relation as that in FIG. 6A except that an oxidizing solution according to the Comparative Example was used.

In FIGS. 6A, 6B, the column term is the treatment temperature, and the row term is the treatment time. For FIG. 6A, an oxidizing solution that had been obtained by an electrolytic current of 0.5 ampere was used. For FIG. 6B, a mixed solution of sulfuric acid and a hydrogen peroxide solution having a concentration of 50% by mass and 1% by mass, respectively, was used. The result of the peeling evaluation is represented by "oo", "o", or "x." That is, "oo" means very good peeling, "o" means good peeling, and "x" means peeling failure.

In the case of FIG. 6A, arsenic (As) ions were accelerated and driven into the above-described evaluation sample of FIG. 3A by an ion implantation method to implant a dose of, for example, about $1 \times 10^{16}/cm^3$. The dose of this evaluation sample is greater than that of the evaluation sample for FIG. 5, therefore the resist mask is hardly peeled off. On this occasion, for exposure treatment, an exposure apparatus that is equipped with a krypton fluoride lamp (wavelength of 850 nm) was used.

As shown in FIG. 6B, it is known that, when a mixed solution for comparison was used, the resist mask could not be peeled off irrespective of the treatment temperature and the treatment time.

On the contrary, as shown in FIG. 6A, it is known that, when the oxidizing solution that had been obtained according to the present embodiment was used, the peeling was possible under any condition. In particular, it can be confirmed that good peeling properties can be obtained when the treatment time is 5 minutes and the treatment temperature is 160° C.

Next, described is properties of the oxidizing solution that is obtained according to the present embodiment for the number of times of repeated peeling.

Figure 7:
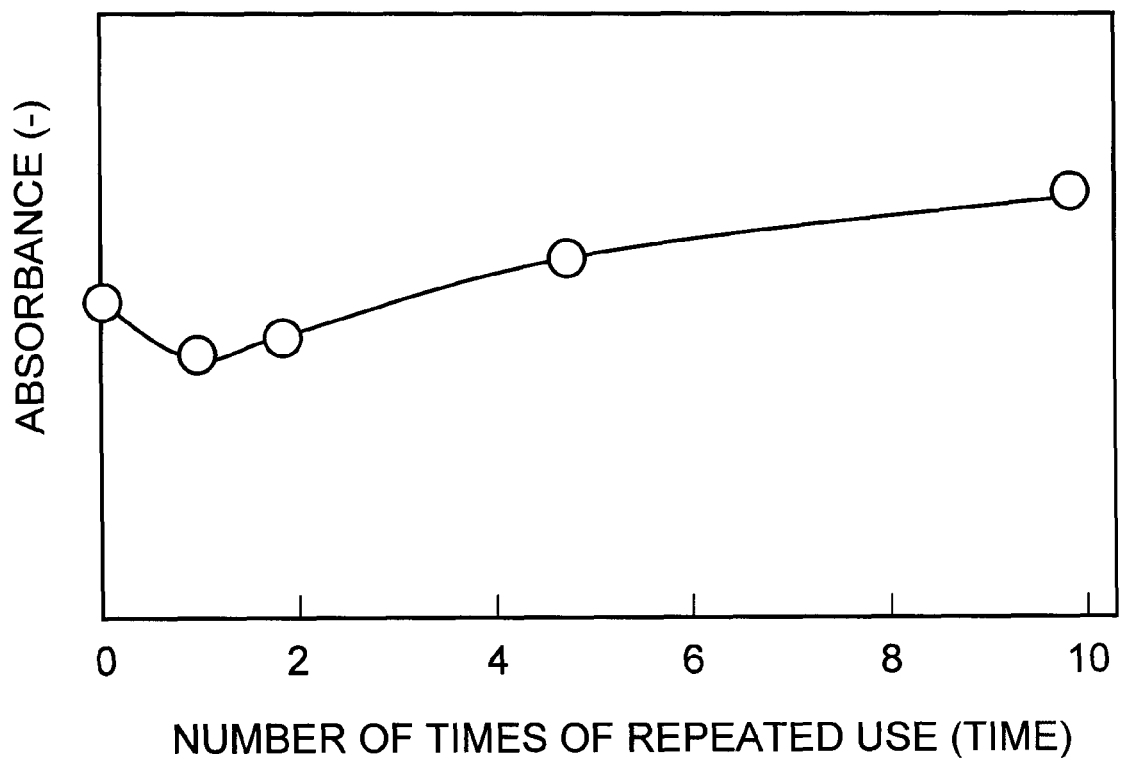
FIG. 7 is a graph chart for exemplifying the relation between the number of times of repeated use for an oxidizing solution and absorbance.

FIG. 7 is a graph chart exemplifying the relation between the number of times of repeated use of the oxidizing solution and the absorbance.

The horizontal axis represents the number of times of repeated use (time) and the vertical axis represents the absorbance (–). The absorbance is a measured value that is obtained using a wavelength of 200 nm.

It was confirmed that the optical density of the dye in the oxidizing solution that had been obtained according to the present embodiment increased along with the increase in the number of times of repeated use.

Further, as shown in FIG. 7, it can be confirmed that the absorbance increases along with the increase in the number of times of repeated use of the oxidizing solution. It is inferred that the phenomenon is due to the increase in the resist mask component that is contained in the oxidizing solution caused by the increase in the number of times of repeated use. It is known that the oxidizing solution has good peeling capacity of the resist mask irrespective of the number of times of repeated use and the dye in the oxidizing solution.

As described above, according to the present embodiment, it is possible to generate such an oxidizing substance, for example, as peroxomonosulfuric acid by electrolysis. Then, by using an oxidizing solution containing the oxidizing substance, contaminants that have adhered solidly to an object to be cleaned can be removed. Further, it becomes possible to generate an oxidizing solution that does not show the degradation of the oxidizing power even after the repeated use thereof. Consequently, it becomes possible to build an inexpensive production process that covers a lot of steps.

Figure 8:
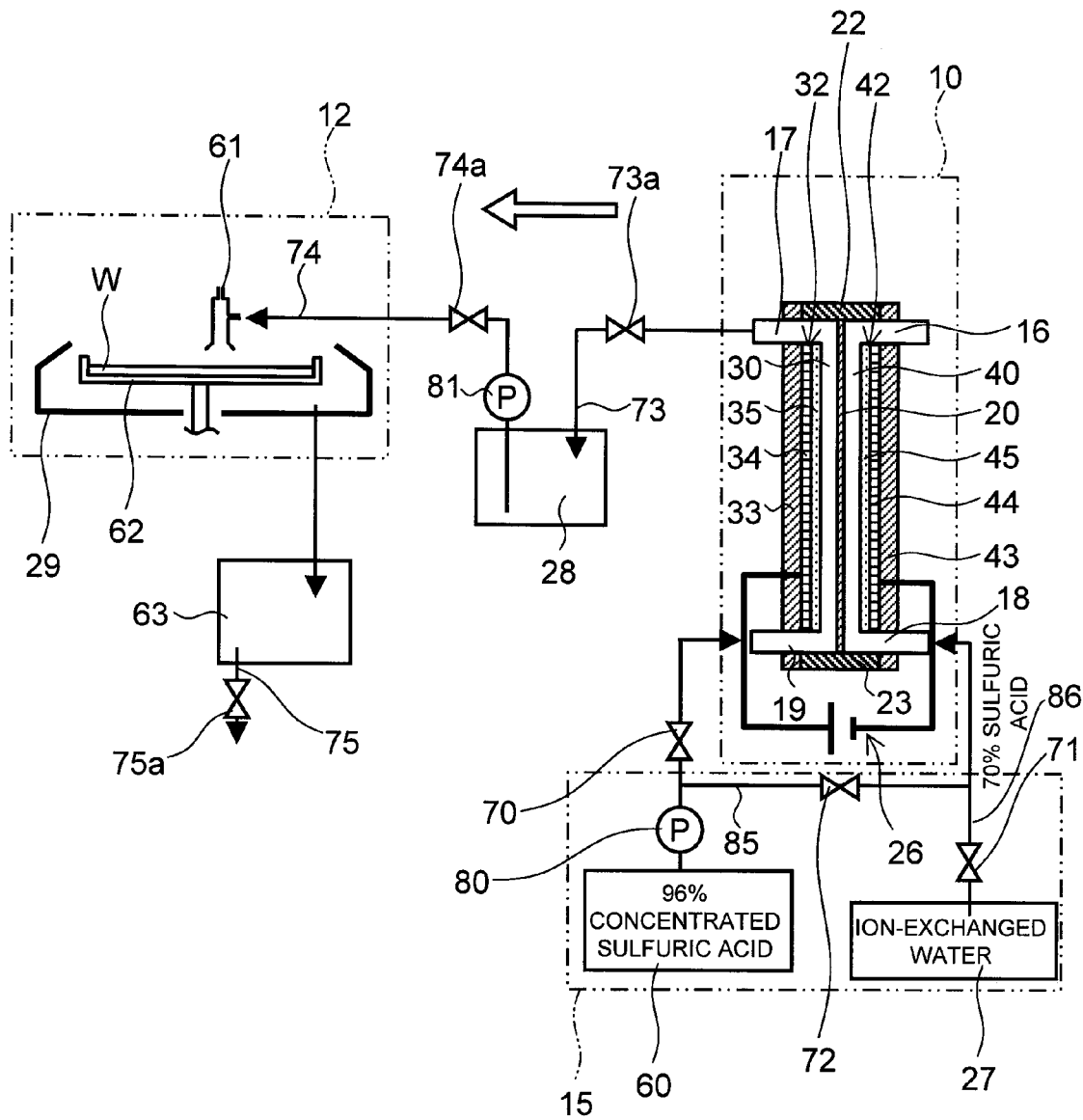
FIG. 8 is a schematic view for exemplifying the constitution of a cleaning system according to another embodiment of the present invention.

The constitution, in which a cleaning solution is circulated through the sulfuric acid electrolytic portion 10 and the cleaning treatment portion 12, does not always have to be provided. Instead, as shown in FIG. 8, such a constitution may be adoptable that a cleaning solution having been used in the cleaning treatment portion 12 is once collected together with contaminants etc. in a recovery tank 63 and then discharged out of the system via the discharge conduit line 75.

The present invention can be used not only for removing a resist mask composed of an organic material, but also for removing metallic impurities, removing particles, and removing dry etching residues as well.

A robot for transporting an object to be cleaned may be provided. A sulfuric acid tank and ion-exchanged water, respectively, may be connected to a line in a plant to be replenished automatically. A rinse tank for rinsing an object to be cleaned from which contaminants have been removed may be provided. The rinse tank may be provided with an overflow-controlling device and a temperature-controlling device using an inline heater. Quartz is favorably used as the material of the rinse tank.

The invention claimed is:

1. A cleaning system comprising:
a sulfuric acid electrolytic portion having an anode, a cathode, a diaphragm which is provided between the anode and the cathode, an anode chamber which is demarcated between the anode and the diaphragm and a cathode chamber which is demarcated between the cathode and the diaphragm, the sulfuric acid electrolytic portion being configured to electrolyze a sulfuric acid solution to generate an oxidizing substance in the anode chamber;
a concentrated sulfuric acid supply portion configured to supply a concentrated sulfuric acid solution to the anode chamber;
a tank storing the oxidizing substance generated by the sulfuric acid electrolytic portion; and
a cleaning treatment portion configured to carry out cleaning treatment of an object to be cleaned using an oxidizing solution comprising the oxidizing substance supplied from the tank, wherein the cleaning system further comprises a solution circulation portion configured to recirculate the oxidizing solution discharged from the cleaning treatment portion to the sulfuric acid electrolytic portion through a recovery tank and a filter and resupply the oxidizing solution from the sulfuric acid electrolytic portion to the cleaning treatment portion through the tank.

2. The cleaning system according to claim 1, wherein a concentration of the concentrated sulfuric acid is 90% by mass or more.

3. The cleaning system according to claim 1, wherein the oxidizing substance is peroxomonosulfuric acid.

4. The cleaning system according to claim 1, wherein a sulfuric acid solution is supplied to the cathode chamber, and the sulfuric acid solution supplied to the cathode chamber has a lower concentration as compared with a sulfuric acid solution which is supplied to the anode chamber.

5. The cleaning system according to claim 1, wherein at least the anode selected from the group consisting of the anode and the cathode includes an electroconductive base substance and an electroconductive diamond membrane which is formed on the surface of the electroconductive base substance.

6. The cleaning system according to claim 1, wherein the concentrated sulfuric acid supply portion includes a tank made of quartz.

7. The cleaning system according to claim 1, wherein the cleaning treatment portion includes a rotary table on which the object to be cleaned is placed, and a nozzle which discharges the oxidizing solution to the object to be cleaned.

8. The cleaning system according to claim 1, wherein the diaphragm is a neutral membrane subjected to hydrophilizing treatment or an ion-exchange membrane.

9. The cleaning system according to claim 1, further comprising an ion-exchanged water supply portion which supplies an ion-exchanged water to the cathode chamber.

10. The cleaning system according to claim 9, wherein the ion-exchanged water supply portion is provided in the anode chamber.

11. A cleaning method comprising:
electrolyzing a concentrated sulfuric acid solution of 90% by mass or more which is supplied to an anode chamber which is demarcated between an anode facing a cathode interposing a diaphragm therebetween and the diaphragm to generate an oxidizing substance in the anode chamber;
storing the oxidizing substance in a tank;
carrying out cleaning treatment of an object to be cleaned using an oxidizing solution containing the oxidizing substance supplied from the tank;
recirculating the oxidizing solution discharged from the cleaning treatment portion to the sulfuric acid electrolytic portion through a recovery tank and a filter; and
resupplying the oxidizing solution from the sulfuric acid electrolytic portion to the cleaning treatment portion through the tank.

12. The cleaning method according to claim 11, wherein the oxidizing substance is peroxomonosulfuric acid.

13. The cleaning method according to claim 11, wherein a sulfuric acid solution is supplied to a cathode chamber being demarcated between the diaphragm and the cathode, and the sulfuric acid solution supplied to a cathode chamber has a lower concentration as compared with a sulfuric acid solution which is supplied to the anode chamber.

14. The cleaning method according to claim 13, wherein the sulfuric acid solution having the lower concentration includes an ion-exchanged water.

15. The cleaning method according to claim 11, wherein at least a part of the oxidizing solution supplied from the anode chamber is supplied to the anode chamber.

16. The cleaning method according to claim 11, wherein at least the anode selected from the group consisting of the anode and the cathode includes an electroconductive base substance and an electroconductive diamond membrane which is formed on the surface of the electroconductive base substance.

17. The cleaning method according to claim 11, wherein the object to be cleaned is placed on a rotary table, and the oxidizing solution is discharged from a nozzle to the object to be cleaned.

18. The cleaning method according to claim 11, wherein oxidizing solution is heated by a heater before the oxidizing solution is applied to the object to be cleaned.

19. The cleaning method according to claim 11, wherein the object to be cleaned is a wafer having a resist mask, and the resist mask is removed by the cleaning treatment.

* * * * *